United States Patent [19]

Mahabadi

[11] Patent Number: 5,001,371
[45] Date of Patent: Mar. 19, 1991

[54] META-STABLE FREE FLIPFLOP

[75] Inventor: John K. Mahabadi, Tempe, Ariz.

[73] Assignee: Motorola, Inc., Schaumburg, Ill.

[21] Appl. No.: 535,618

[22] Filed: Jun. 11, 1990

[51] Int. Cl.$^5$ ................... H03K 3/356; H03K 3/037
[52] U.S. Cl. .................................... 307/480; 307/481;
307/452
[58] Field of Search ............ 307/443, 480, 481, 451,
307/272.3, 279, 452, 453

[56] References Cited

U.S. PATENT DOCUMENTS 4,591,737 5/1986 Campbell ............................ 307/481
4,629,909 12/1986 Cameron ............................ 307/481

Primary Examiner—David Hudspeth
Assistant Examiner—Andrew Sanders
Attorney, Agent, or Firm—Michael D. Bingham; Robert D. Atkins

[57] ABSTRACT

A flipflop circuit is responsive to a clock signal for latching the terminal logic state of the input signal at an output irrespective of the relative transistions of the input data signal and the clock signal thereby providing immunity from the meta-stable condition. The input data signal is propagated from the input through a first stage to an intermediate node during a first clock cycle. A boost signal is applied at the intermediate node via first or second transistors for driving the potential developed thereat toward the terminal logic state of the input data signal. The logic state stored at the intermediate node may be used as the output signal or passed through additional buffer stages to an output during subsequent cycles of the clock signal.

18 Claims, 2 Drawing Sheets

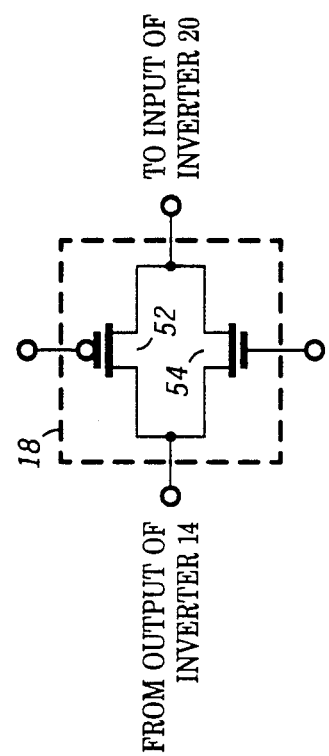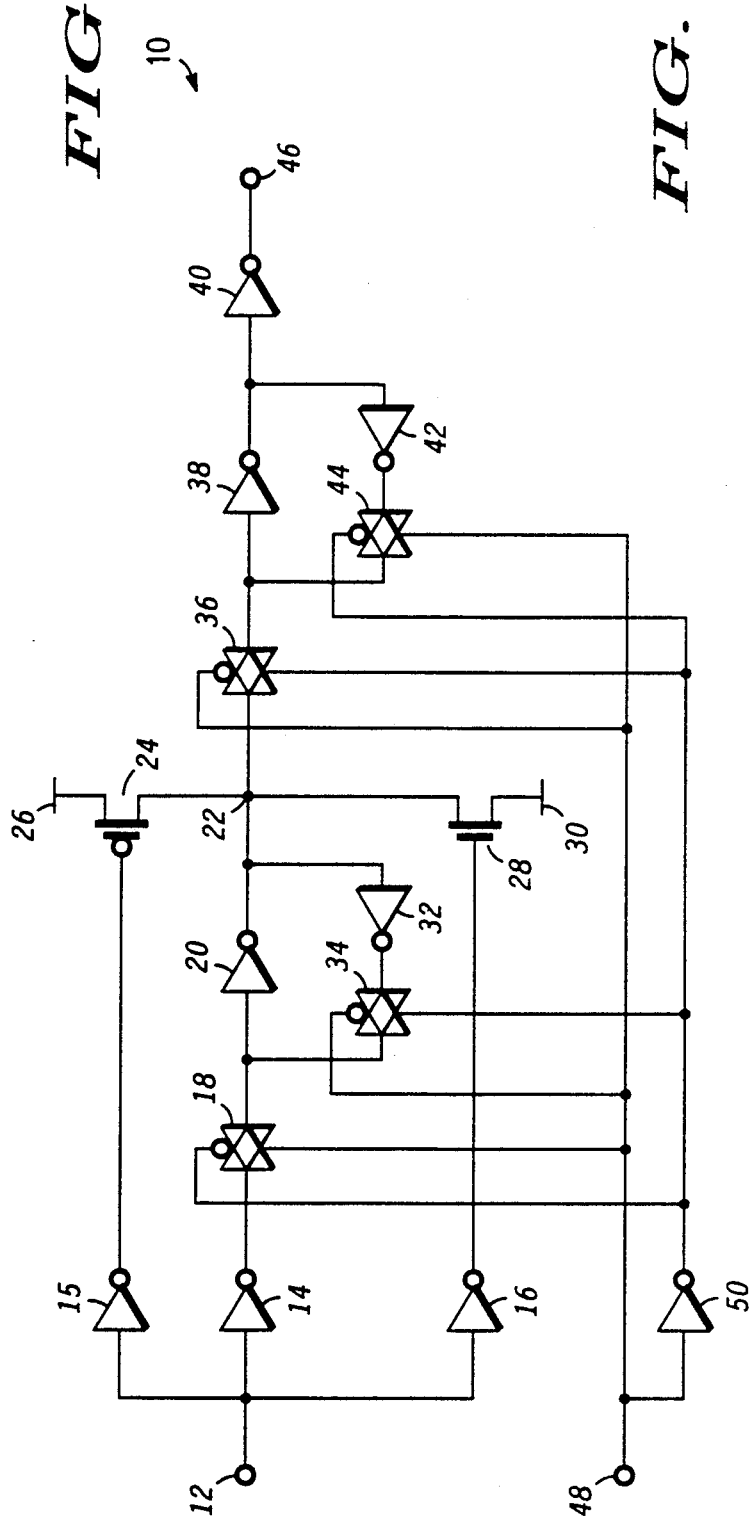

META-STABLE FREE FLIPFLOP

BACKGROUND OF THE INVENTION

This invention relates in general to flipflop circuits, and more particularly, to a flipflop circuit wherein the terminal logic state of the input data signal is latched at the output thereof even if the data and clock signals transition simultaneously thereby avoiding the meta-stable condition.

The conventional flipflop circuit may be found in a myriad of applications and typically includes one or more data inputs, a clock input, and a data output port. The flipflop circuit may operate on either the rising or falling edge of the clock signal (positive or negative edge triggered) for latching the input data signal at the data output thereof. In most if not all applications, the input data signal operates at a much lower frequency and asynchronous with respect to the clock signal. If there is sufficient settling time between the transition of the input data signal and the clock edge, then the output signal latches to the logic state of the input data signal. However, if the data and clock signals change state simultaneously, the flipflop circuit may sample the input data signal at some intermediate level between logic states. The state of the output signal is thus unknown as it may settle to either logic state depending upon the intermediate level of the input data signal at the sample point. This is known as the meta-stable condition and frequently leads to numerous problems during design and afterward in operation. It is desirable to avoid the meta-stable state and always provide a known logic state for the output data signal.

Hence, what is needed is an improved flipflop circuit which avoids the meta-stable condition by providing the terminal logic state of the asynchronous input data signal at the output thereof irrespective of the relative position of the edge of the clock signal.

SUMMARY OF THE INVENTION

Accordingly, an objective of the present invention is to provide an improved flipflop circuit.

Another objective of the present invention is to provide an improved flipflop circuit having immunity from the meta-stable condition.

A further objective of the present invention is to provide an improved flipflop circuit having a known logic state of the output data signal irrespective of the relative transitions of the input data signal and the clock signal.

Still a further objective of the present invention is to provide an improved flipflop circuit which achieves the terminal logic state of the input data signal at the output thereof even if the clock and data signals transition simultaneously.

In accordance with the above and other objectives there is provided a flipflop circuit responsive to a clock signal for latching an input data signal at an output comprising a circuit coupled between the input and the output for propagating the input signal applied at the input. The circuit includes an intermediate node wherein the input data signal is propagated through to the intermediate node during a first portion of the clock signal and passed through to the output during a second portion of the clock signal. A first transistor is provided having a gate coupled for receiving the inverse state of the input data signal, a source coupled to a first source of operating potiential and a drain coupled to the intermediate node. The gate of a second transistor is coupled for receiving the inverse state of the input data signal while its source is coupled to a second source of operating potential and drain is coupled to the intermediate node whereby the potential stored at the intermediate node is charged toward the terminal logic state of the input data signal.

BRIEF DESCRIPTION OF THE DRAWING

FIG. 1 is a schematic diagram illustrating the preferred embodiment of the present invention;

FIG. 2 is a schematic diagram illustrating a transmission gate of the present invention.

DETAILED DESCRIPTION OF THE PREFERRED EMBODIMENT

Figure 3:
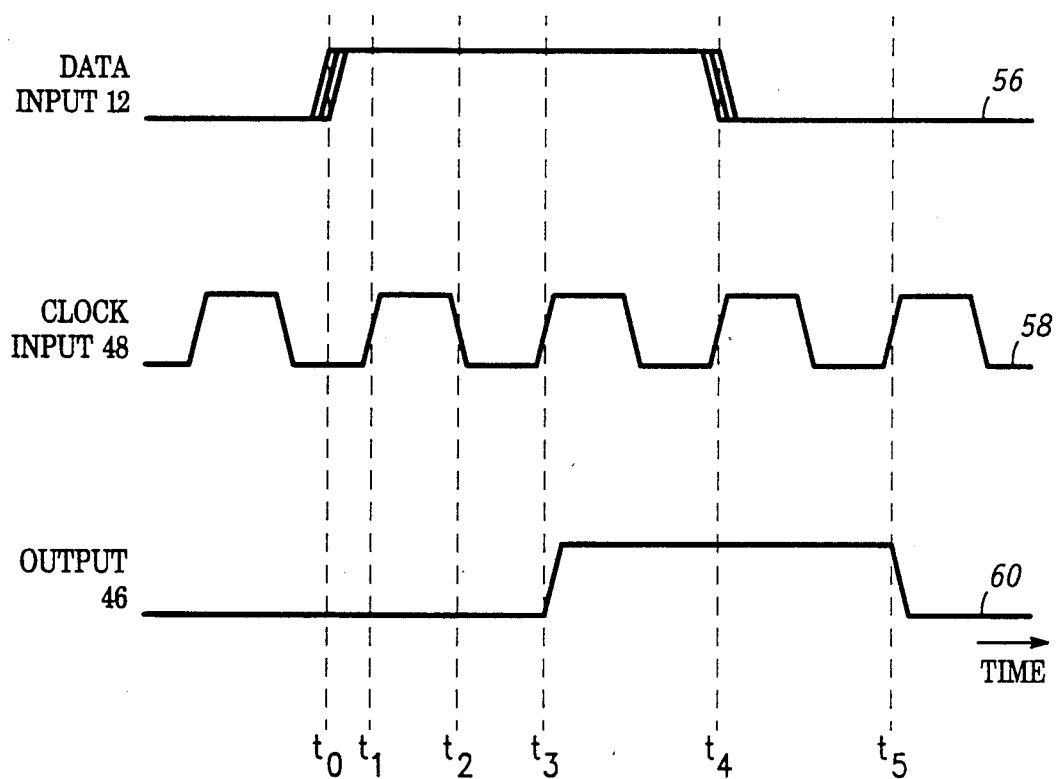
FIG. 3 is a waveform plot useful in the explanation of the present invention.

Referring to FIG. 1, there is shown flipflop circuit 10 suitable for manufacturing in integrated circuit form using conventional integrated circuit processes. A digital input signal is applied at input 12 that is the input of inverters 14, 15 and 16. The output of inverter 14 is coupled through transmission gate 18 to the input of inverter 20, the output of which is node 22. The output of inverter 15 is coupled to the gate of P-channel CMOS transistor 24 which includes a drain terminal coupled to node 22 and a source terminal connected to power supply conductor 26, typically operating at a positive potential such as $V_{DD}$. Likewise, the output of inverter 16 is coupled to the gate of N-channel CMOS transistor 28 also having a drain terminal coupled to node 22 and a source terminal coupled to power supply conductor 30, typically operating at ground potential. Inverter 32 and transmission gate 34 are serially coupled between node 22 and the input of inverter 20. Hence, the first stage of flipflop circuit 10 includes inverters 14, 20 and 32 and transmission gate 18 and 34 for developing a known logic state at node 22 equal to the terminal state (state after the signal transition) of the input data signal.

The output of inverter 20 is also coupled through transmission gate 36 to the input of inverter 38, the output of which is coupled to the input of inverter 40 and through the series combination of inverter 42 and transmission gate 44 to the input of inverter 38 collectively forming a second stage of flipflop circuit 10. Output 46 is provided at the output of inverter 40. The clock signal applied at input 48 and its inverse provided at the output of inverter 50 control transmission gates 18, 34, 36 and 44. As shown, transmission gates 18 and 44 are enabled at the rising edge of the clock signal and disabled at the next falling edge, while transmission gates 34 and 36 conduct between the falling edge and the rising edge thereof.

Turning to FIG. 2, the detail of transmission gate 18 is shown including parallel combination of P-channel transistor 54. The drain of transistor 52 and the drain of transistor 54 are coupled together to the input of transmission gate 18, while the source of transistor 52 and the source of transistor 54 are coupled together to the output. The N-channel input of transmission gate 18, that is the gate of transistor 54 is coupled to input 48, and the P-channel input of transmission gate 18, that is the gate of transistor 52, is coupled for receiving the inverse of the clock signal provided at the output of inverter 50. The circle schematically shown in FIG. 1 at one of the two control inputs of transmission gates 18, 34, 36 and 44 depicts the P-channel input. Transmission gates 34, 36 and 44 follow a similar construction. It is understood that the signal applied at the gates of transistors 52 and 54 may be reversed thereby changing the positive edge triggered operation to a negative edge triggered one.

The operation of flipflop circuit 10 proceeds as follows with reference to the waveform plots illustrated in FIG. 3 which are useful in the explanation of the invention. The input data signal applied at input 12 is shown as waveform 56, and the clock signal applied at input 48 is waveform 58, while waveform 60 illustrates the output data signal provided at output 46. The input data signal is assumed to operate asynchronous with respect to the clock signal, the latter of which is shown operating at lower than normal frequency to aid in the explanation of the circuit. At approximately time $t_0$, the input data signal changes state from logic zero to logic one and the output signals of inverters 14, 15 and 16 transition toward logic zero. After ample settling time, the rising edge of the clock signal at time $t_1$ enables transmission gate 18 for propagating the logic zero provided at the output of inverter 14 to the input of inverter 20 thereby developing a logic one of node 22. It can be seen in FIG. 2 that the high clock signal between times $t_1$ and $t_2$ turns on transistor 54 while the inverse thereof renders transistor 52 conductive for providing bi-directional transmission therethrough. The falling edge of the clock signal at time $t_2$ disables transmission gate 18 by inverting the signal applied at the gates of transistors 52 and 54 which isolates the driving signal provided at the output of inverter 14 from the input of inverter 20. The falling edge of the clock signal also enables transmission gate 34 creating a feedback path via inverter 32 for maintaining the logic one signal at node 22. As the clock signal rises at time $t_3$, the logic one at node 22 is propagated through transmission gate 36 and inverters 38 and 40 developing a logic one at output 46. The falling edge of the clock signal disables transmission gate 36 and enables transmission gate 44 completing the feedback path comprising inverter 42 and locking the input of inverter 38 at logic one and likewise at output 46. Thus, given sufficient settling time, i.e. between times $t_0$ and $t_1$, most if not all flipflop circuits including those of the prior art are well behaved and the potential meta-stable condition is generally not a problem.

Now consider the case when the input data signal transitions with the clock signal such as shown at time $t_4$. Notably, the frequency of the clock signal typically operates at a much higher rate than illustrated in FIG. 3 whereby one cycle may be completed with the transition of the input data signal. In the prior art, if the input data signal from $V_{DD}$ (logic one) to ground potential (logic zero) across time $t_4$, then it is possible for the input data signal to be sampled at some undefined intermediate level of say $V_{DD}/2$. That is, the rising edge of the clock signal enables transmission gate 18 to propagate an input data signal level of $V_{DD}/2$ to node 22 where it is stored at the next falling edge of the clock signal. The undefined logic state $V_{DD}/2$ is propagated to output 46 with the next cycle of the clock signal. While this scenario often leads to the meta-stable condition for the prior art, flipflop circuit 10 avoids this condition with transistors 24 and 28 whereby node 22 is charged to the terminal logic state of the input data signal. For example, although the short period of the clock signal may have left a level of $V_{DD}/2$ at node 22, the output signal of inverter 16 continues charging toward the inverse of the terminal state of the input data signal thereby turning on transistor 28 and pulling node 22 to a solid logic zero. The next cycle of the clock signal propagates the logic zero from node 22 through inverters 38 and 40 to output 46 thus avoiding the meta-stable condition. Conversely, if the input data signal changes state from logic zero to logic one at the rising edge of the clock signal, the output signal of inverter 15 continues charging toward logic zero even after the input data signal is sampled via transmission gate 18. Transistor 24 conducts charging node 22 to the logic one of power supply conductor 26. Again, the following cycle of the clock signal pass the logic one at node 22 to output 46. In another embodiment, additional stages may be appended to output 46 for buffering the output signal, or conversely, it is possible to use the logic state developed at node 22 directly as the output signal and eliminate the second stage comprising inverters 38, 40 and 42 and transmission gates 36 and 44.

The action of transistor 24 and 28 is a key feature of the present invention for insuring that the potential developed at node 22 is driven to the terminal logic state of the input data signal. The drive capacity of transistors 24 and 28 is typically much less than inverter 20, and operate to boost the potential at node 22 toward the proper logic state. Inverter 15 and 16 keep the boost signals of transistors 24 and 28 in phase with the output signal of inverter 20.

Hence, what has been described in a novel flipflop circuit for avoiding the meta-stable condition by using boost transistors for pulling the intermediate node thereof toward the terminal state of the input signal thereby providing a known logic state at the output.

I claim:

1. A flipflop circuit responsive to a clock signal for latching at an output an input data signal applied at an input, comprising:

circuit means coupled between the input and the output for propagating the input signal applied at the input, the circuit means having an intermediate node wherein the input data signal is propagated through to said intermediate node during a first portion of the clock signal and passed through to the output during a second portion of the clock signal;

a first transistor having a gate, a drain and a source, said gate being coupled for receiving the inverse state of the input data signal, said source being coupled to a first source of operating potential, said drain being coupled to said intermediate node; and a second transistor having a gate, a drain and a source, said gate being coupled for receiving the inverse state of the input data signal, said source being coupled to a second source of operating potential, said drain being coupled to said intermediate node.

2. The flipflop circuit of claim 1 further including a first inverter coupled between the input and said gate of said first transistor.

3. The flipflop circuit of claim 2 further including a second inverter coupled between the input and said second transistor.

4. The flipflop circuit of claim 3 wherein said circuit means includes:

a third inverter having an input coupled to the input of the flipflop circuit and having an output;

a first transmission gate having an input, an output and first and second control inputs, said input being coupled to said output of said third inverter, said first control input being coupled for receiving the inverse of the clock signal, said second control input being coupled for receiving the clock signal;

a fourth inverter having an input coupled to said output of said first transmission gate and having and output coupled to said intermediate node;

a fifth inverter having an input coupled to said output of said fourth inverter and having an output; and a second transmission gate having an input, an output and first and second control inputs, said input being coupled to said output of said fifth inverter, said output being coupled to said input of said fourth inverter, said first control input being coupled for receiving the clock signal, said second control input being coupled for receiving the inverse of the clock signal.

5. The flipflop circuit of claim 4 wherein said circuit means further includes:

a third transmission gate having an input, an output and first and second control inputs, and input being coupled to said intermediate node, said first control input being coupled for receiving the clock signal, said second control input being coupled for receiving the inverse of the clock signal;

a sixth inverter having an input coupled to said output of said third transmission gat and having an output;

a seventh inverter having an input coupled to said output of said sixth inverter and having an output coupled to the output of the flipflop circuit;

an eighth inverter having an input coupled to said output of said sixth inverter and having an output; and a fourth transmission gate having an input, an output and first and second control inputs, said input being coupled to said output of said eighth inverter, said output being coupled to said input of said sixth inverter, said first control input being coupled for receiving the inverse of the clock signal, said second control input being coupled for receiving the clock signal.

6. The flipflop circuit of claim 5 wherein said first transmission gate includes:

a third transistor having a gate, a drain and a source, said gate being coupled to said first control input of said first transmission gate, said drain being coupled to said input, said source being coupled to said output; and a fourth transistor having a gate, a drain and a source, said gate being coupled to said second control input of said first transmission gate, said drain being coupled to said input, said source being coupled to said output.

7. A circuit for latching an input data signal at an output in response to a clock signal including a circuit means coupled between the input and the output for propagating the input signal therebetween, the circuit means having an intermediate node wherein the input data signal is propagated through to said intermediate node during a first portion of the clock signal and passed through to the output during a second portion of the clock signal, wherein the improvement comprises:

a first transistor having a gate, a drain and a source, said source being coupled to a first source of operating potential, said drain being coupled to said intermediate node;

a first inverter coupled between the input and said gate of said first transistor;

a second transistor having a gate, a drain and a source, said source being coupled to a second source of operating potential, said drain being coupled to said intermediate node; and a second inverter coupled between the input and said gate of said second transistor.

8. The flipflop circuit of claim 7 wherein the circuit means includes:

a third inverter having an input coupled to the input of the flipflop circuit and having an output;

a first transmission gate having an input, an output and first and second controls inputs, said input being coupled to said output of said third inverter, said first control input being coupled for receiving the inverse of the clock signal, said second control input being coupled for receiving the clock signal;

a fourth inverter having an input coupled to said output of said first transmission gate and having an output coupled to said intermediate node;

a fifth inverter having an input coupled to said output of said fourth inverter and having an output; and a second transmission gate having an input, an output and first and second control inputs, said input being coupled to said output of said fifth inverter, said output being coupled to said input of said fourth inverter, said first control input being coupled for receiving the clock signal, said second control input being coupled for receiving the inverse of the clock signal.

9. The flipflop circuit of claim 8 wherein the circuit means further includes:

a third transmission gate having an input, an output and first and second control inputs, said input being coupled to said intermediate node, said first control input being coupled for receiving the clock signal, said second control input being coupled for receiving the inverse of the clock signal;

a sixth inverter having an input coupled to said output of said third transmission gate and having an output;

a seventh inverter having an input coupled to said output of said sixth inverter and having an output coupled to the output of the flipflop circuit;

an eighth inverter having an input coupled to said output of said sixth inverter and having an output; and a fourth transmission gate having an input, an output and first and second control inputs, said input being coupled to said output of said eighth inverter, said output being coupled to said input of said sixth inverter, said first control input being coupled for receiving the inverse of the clock signal, said second control input being coupled for receiving the clock signal.

10. The flipflop circuit of claim 9 wherein said first transmission gate includes:

a third transistor having a gate, a drain and a source, said gate being coupled to said first control input of said first transmission gate, said drain being coupled to said input, said source being coupled to said output; and a fourth transistor having a gate, a drain and a source, said gate being coupled to said second control input of said first transmission gate, said drain being coupled to said input, said source being coupled to said output.

11. A method of providing a known logic state for the output signal of a flipflop circuit when the input data signal changes state at the edge of an applied clock signal, comprising the steps of:

propagating the input data signal from the input to an intermediate node during a first portion of the clock signal; and applying a boost signal for driving the signal stored at said intermediate node to the terminal logic state of the input data signal.

12. The method of claim 11 further comprising the step of passing the logic state stores at the intermediate node to the output during a second portion of the clock signal.

13. The method of claim 12 wherein the step of propagating the input data signal includes the steps of:

inverting the input data signal:

sampling the inverted input data signal; and inverting the inverted input data signal and storing the signal level thereof at said intermediate node.

14. The method of claim 13 wherein the step of applying a boost signal includes the steps of:

inverting the input data signal: and enabling a transistor coupled between a source of operating potential and said intermediate node for charging the logic state thereof toward the terminal logic state of the input data signal.

15. A flipflop circuit responsive to a clock signal for latching at an output an input data signal applied at an input, comprising:

circuit means coupled between the input and the output for propagating the input signal therebetween, wherein the input data signal is propagated through to the output during a first portion of the clock signal;

a first transistor having a gate, a drain and a source, said gate being coupled for receiving the inverse state of the input data signal, said source being coupled to a first source of operating potential, said drain being coupled to the output; and a second transistor having a gate, a drain and a source, said gate being coupled for receiving the inverse state of the input data signal, said source being coupled to a second source of operating potential, said drain being coupled to the output.

16. The flipflop circuit of claim 15 further including a first inverter coupled between the input and said gate of said first transistor.

17. The flipflop circuit of claim 16 further including a second inverter coupled between the input and said gate of said second transistor.

18. The flipflop circuit of claim 17 wherein said circuit means includes:

a third inverter having an input coupled to the input of the flipflop circuit and having an output;

a first transmission gate having an input, an output and first and second control inputs, said input being coupled to said output of said third inverter, said first control input being coupled for receiving the inverse of the clock signal, said second control input being coupled for receiving the clock signal;

a fourth inverter having an input coupled to said output of said first transmission gate and having an output coupled to the output of the flipflop circuit;

a fifth inverter having an input coupled to said output of said fourth inverter and having an output; and a second transmission gate having an input, an output and first and second control inputs, said input being coupled to said output of said fifth inverter, said output being coupled to said input of said fourth inverter, said first control input being coupled for receiving the clock signal, said second control input being coupled for receiving the inverse of the clock signal.

* * * * *